US012681047B2

(12) United States Patent
Yokoyama et al.

(10) Patent No.: US 12,681,047 B2
(45) Date of Patent: Jul. 14, 2026

(54) COMPOSITE PROBE, METHOD FOR ATTACHING PROBE, AND METHOD FOR MANUFACTURING PROBE CARD

(71) Applicant: JAPAN ELECTRONIC MATERIALS CORPORATION, Hyogo (JP)

(72) Inventors: Kazuo Yokoyama, Hyogo (JP); Masaya Inoue, Hyogo (JP); Yuusuke Miyagawa, Hyogo (JP)

(73) Assignee: JAPAN ELECTRONIC MATERIALS CORPORATION, Hyogo (JP)

( * ) Notice: Subject to any disclaimer, the term of this patent is extended or adjusted under 35 U.S.C. 154(b) by 150 days.

(21) Appl. No.: 18/728,467

(22) PCT Filed: Mar. 16, 2022

(86) PCT No.: PCT/JP2022/012060
§ 371 (c)(1),
(2) Date: Jul. 12, 2024

(87) PCT Pub. No.: WO2023/175800
PCT Pub. Date: Sep. 21, 2023

(65) Prior Publication Data
US 2025/0085311 A1      Mar. 13, 2025

(51) Int. Cl.
G01R 3/00 (2006.01)
G01R 1/073 (2006.01)

(52) U.S. Cl.
CPC .......... G01R 3/00 (2013.01); G01R 1/07342 (2013.01)

(58) Field of Classification Search
CPC .. G01R 3/00; G01R 1/07342; G01R 1/07357; G01R 1/073; G01R 1/06705; G01R 1/06761; G01R 1/07314

(Continued)

(56) References Cited

U.S. PATENT DOCUMENTS

| | | | | |
|---|---|---|---|---|
| 6,255,832 | B1 * | 7/2001 | Notohardjono | .... G01R 1/07357 |
| | | | | 324/750.25 |
| 2012/0042516 | A1 * | 2/2012 | Takeya | ............... G01R 1/07357 |
| | | | | 29/852 |

(Continued)

FOREIGN PATENT DOCUMENTS

| | | |
|---|---|---|
| JP | 10-221374 A | 9/1998 |
| JP | 2007155474 A | 6/2007 |

(Continued)

OTHER PUBLICATIONS

International Search Report and Written Opinion issued in corresponding International Patent Application No. PCT/JP2022/012060 (with English translation of International Search Report) mailed Jun. 7, 2022 (7 pages).

*Primary Examiner* — Roberto Velez
(74) *Attorney, Agent, or Firm* — Kilyk & Bowersox, P.L.L.C.

(57) ABSTRACT

[Problem] The purpose of the present invention is to facilitate the insertion of a probe into two or more guide plates. [Solution] The present invention is provided with: a probe body 600 accommodated in a guide unit 30 for a probe card 1, the guide unit 30 comprising a first guide plate 301 and a second guide plate 302 disposed with a gap therebetween, and supported by a first guide hole 311 of the first guide plate 301 and a second guide hole 312 of the second guide plate 302; and a leader rod 610 that has a substantially linear shape with one end thereof connected to the probe body 600, that is inserted into the first guide hole 301 earlier than the probe body 600, and that can be separated from the probe body 600 after passing through the second guide hole 302.

11 Claims, 14 Drawing Sheets

(58) Field of Classification Search
USPC ............ 324/756.03, 756.04, 754.11, 755.02,
324/755.05, 755.06, 755.07, 755.11
See application file for complete search history.

(56) References Cited

U.S. PATENT DOCUMENTS

| | | |
|---|---|---|
| 2014/0110372 A1 | 4/2014 | Nasu |
| 2019/0041428 A1 | 2/2019 | Park |
| 2020/0271693 A1* | 8/2020 | Ahn ................... G01R 1/07371 |
| 2025/0180605 A1* | 6/2025 | Kurachi ............. G01R 1/06716 |

FOREIGN PATENT DOCUMENTS

| | | |
|---|---|---|
| JP | 2012042331 A | 3/2012 |
| JP | 2014016205 A | 1/2014 |
| JP | 2014085216 A | 5/2014 |

* cited by examiner (a)

(b)

(c)

(a)

(b)

(c)

COMPOSITE PROBE, METHOD FOR ATTACHING PROBE, AND METHOD FOR MANUFACTURING PROBE CARD

This application is a National Stage Application of PCT/JP2022/012060, filed Mar. 16, 2022.

TECHNICAL FIELD

The present invention relates to a composite probe, a method for attaching a probe, and a method for manufacturing a probe card, in particular, to a composite probe using for attaching a probe to a guide unit including two or more guide plates, a method for attaching a probe using a composite probe, and a method for manufacturing a probe card including a method for attaching a probe.

BACKGROUND ART

A probe card is an inspection device used for testing the electrical characteristics of semiconductor devices formed on a semiconductor wafer. It is equipped with a large number of probes, each making contact with electrode terminals on the semiconductor wafer, provided on a wiring substrate.

A probe card includes a guide unit that supports the probes and a wiring substrate to which the guide unit is attached. The guide unit includes two or more guide plates arranged parallel to each other at a predetermined distance. A probe is sequentially inserted through the guide holes of these guide plates and is supported to move up and down. The probe card is manufactured by attaching the guide unit, which houses the probes, to the wiring substrate.

When inserting a probe sequentially through the guide holes of two or more guide plates, it is relatively easy to insert the probe through the guide hole of the first guide plate. However, there is an issue that it is not easy to insert the probe through the guide holes of the second and subsequent guide plates. Particularly, if the probe has a curved portion, there is a problem that it is difficult to insert the probe through two or more guide plates.

FIG. 14 is a diagram showing how the probe 50 is attached to the guide unit 30. The guide unit 30 includes an upper guide plate 301 and a lower guide plate 302, which are arranged apart from each other. The upper guide plate 301 is provided with upper guide holes 311, and the lower guide plate 302 is provided with lower guide holes 312.

When the probe 50, which is sequentially inserted through the upper guide hole 311 and the lower guide hole 312, has a curved portion 503, the posture of the probe 50 changes as the curved portion 503 passes through the upper guide hole 311, causing a positional shift of the tip of the probe 50. For this reason, it is not easy to insert the tip of the probe 50 through the lower guide hole 312. If forced, it may result in damage or deformation of the probe. This issue arises not only when the probe 50 has a curved portion 503 but also when warping occurs during the manufacturing process of the probe 50.

As a conventional technique, a method has been proposed in which a removable tab is attached to the probe and the tab is gripped using a gripper (for example, Patent Literature 1). However, this does not address the problem caused by the change in the posture of the probe when inserting the probe through two or more guide plates.

CITATION LIST

Patent Literatures

Patent Literature 1: JP 2014-16205 A

SUMMARY OF THE INVENTION

Technical Problem

It is an object of the present invention to facilitate the insertion of a probe through two or more guide plates in view of the above circumstances. In particular, it is an object of the present invention to provide a composite probe that can be easily attached to a guide unit. It is also an object of the present invention to provide a method for attaching a probe to a guide unit using a composite probe. Furthermore, it is an object of the present invention to provide a method for manufacturing a probe card using a composite probe.

Solution to the Problem

In the composite probe according to the first embodiment of the present invention, a probe body is housed in a guide unit of a probe card including a first guide plate and a second guide plate arranged apart from each other, and supported by a first guide hole of the first guide plate and a second guide hole of the second guide plate. The composite probe includes a leader rod, one end of which is connected to the probe body, having a substantially straight shape, inserted through the first guide hole ahead of the probe body, further passing through the second guide hole, and detachable from the probe body after passing through the second guide hole. By adopting such a configuration, the probe is provided as a probe body constituting the composite probe together with the leader rod, facilitating the work of attaching the probe to the guide unit.

In the composite probe according to the second embodiment of the present invention, in addition to the above configuration, the probe body includes a first rod having a substantially straight shape and supported by the first guide hole, a second rod having a substantially straight shape and supported by the second guide hole, and a curved portion disposed between the first guide plate and the second guide plate, and connecting the first rod and the second rod. The leader rod is connected to a tip of the second rod and is configured to be coaxial with the second rod. By adopting such a configuration, the work of attaching the probe with a curved portion to the guide unit can be facilitated.

In the composite probe according to the third embodiment of the present invention, in addition to the above configuration, a total length of the leader rod and the second rod is configured to be greater than a distance between non-facing surfaces of the first guide plate and the second guide plate. By adopting such a configuration, the leader rod can be inserted into the second guide hole before the curved portion is inserted through the first guide hole, thereby facilitating the attachment of the probe to the guide unit.

In the composite probe according to the fourth embodiment of the present invention, in addition to the above configuration, a length of the leader rod is configured to be greater than a distance between non-facing surfaces of the first guide plate and the second guide plate. By adopting such a configuration, the leader rod can be inserted through the second guide hole before the connecting portion, which connects the probe body and the leader rod, reaches the first guide hole. Therefore, it is possible to prevent the connecting portion from breaking before the leader rod is inserted through the second guide hole, thereby further facilitating the attachment of the probe to the guide unit.

In the composite probe according to the fifth embodiment of the present invention, in addition to the above configuration, the leader rod is configured to have a length equal to or greater than that of the probe body. By adopting such a configuration, as long as the guide unit is capable of accommodating the probe body, the leader rod can be inserted through the second guide hole before the connecting portion, which connects the probe body and the leader rod, reaches the first guide hole, regardless of the distance between the first guide plate and the second guide plate.

In the composite probe according to the sixth embodiment of the present invention, in addition to the above configuration, a tip of the leader rod opposite to the probe body is tapered. By adopting such a configuration, the insertion of the leader rod through the first guide hole and the second guide hole can be further facilitated.

In the composite probe according to the seventh embodiment of the present invention, in addition to the above configuration, the leader rod and the second rod are metal layers sequentially laminated by a plating method and bonded at interfaces approximately parallel to the lamination direction. By adopting such a configuration, the leader rod can be easily detached from the probe body.

In the composite probe according to the eighth embodiment of the present invention, in addition to the above configuration, a connecting portion connecting the leader rod and the second rod is provided, wherein the connecting portion is configured to have a smaller minimum cross-sectional area than the leader rod and the second rod. By adopting such a configuration, the leader rod can be easily detached from the probe body.

In the composite probe according to the ninth embodiment of the present invention, in addition to the above configuration, the connecting portion is a metal layer laminated by a plating method, and a width on a lamination plane is configured to be smaller than that of the leader rod and the second rod.

In the composite probe according to the tenth embodiment of the present invention, in addition to the above configuration, the connecting portion is a metal layer laminated by a plating method, and a thickness in a lamination direction is configured to be smaller than that of the leader rod and the second rod.

In the method for attaching a probe according to the eleventh embodiment of the present invention, a probe is attached to a guide unit of a probe card including a first guide plate and a second guide plate arranged apart from each other. The method includes inserting a leader rod, which is connected to a tip of a probe body, through a first guide hole of the first guide plate ahead of the probe body by using a composite probe constituted by the probe body and the leader rod, further inserting the leader rod, inserted through the first guide hole, through a second guide hole of the second guide plate, and detaching the leader rod from the probe body while the probe body is supported by the first guide hole and the second guide hole. By adopting such a configuration, the probe is provided as a probe body constituting the composite probe together with the leader rod, facilitating the work of attaching the probe to the guide unit.

In the method for attaching a probe according to the twelfth embodiment of the present invention, in addition to the above configuration, the probe body includes a first rod supported by the first guide hole, a second rod supported by the second guide hole, and a curved portion disposed between the first guide plate and the second guide plate, and connecting the first rod and the second rod. The leader rod is configured to be inserted through the second guide hole before the curved portion is inserted through the first guide hole. By adopting such a configuration, the leader rod can be inserted through the second guide hole before the curved portion is inserted through the first guide hole, facilitating the attachment of the probe to the guide unit.

In the method for manufacturing a probe card according to the thirteenth embodiment of the present invention, the method includes using the above method for attaching a probe to attach a probe to a guide unit, and attaching the guide unit to which the probe is attached to a wiring board. By adopting such a configuration, the manufacturing of the probe card can be facilitated.

Advantages of the Invention

According to the present invention, it is possible to facilitate the insertion of a probe through two or more guide plates. In particular, it is possible to provide a composite probe that can be easily attached to a guide unit. Moreover, it is possible to provide a method for easily attaching a probe to a guide unit. Furthermore, it is possible to provide a method for easily manufacturing a probe card.

DETAILED DESCRIPTION OF THE INVENTION

First Embodiment (1) Composite Probe 60

Figure 1:
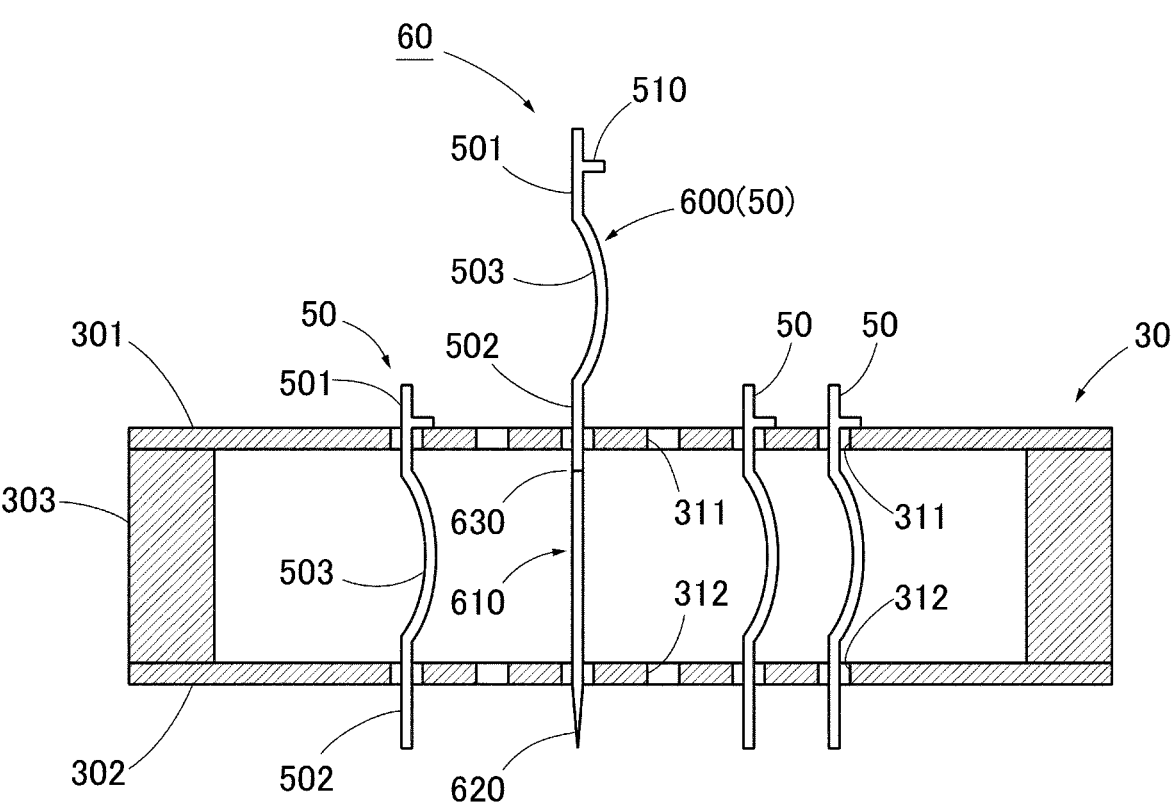
FIG. 1 is a diagram showing a configuration example of a composite probe 60 according to the first embodiment of the present invention.

FIG. 1 is a diagram showing a configuration example of a composite probe 60 according to the first embodiment of the present invention, and it shows an example of how a probes 50 are attached to a guide unit 30 using a composite probe 60.

The composite probe 60 is constructed by connecting a leader rod 610 to one end of a probe body 600. The probe body 600 corresponds to the probe 50 that is attached to the guide unit 30. A leader rod 610 is a leader that is inserted through guide holes 311 and 312 of the guide unit 30 ahead of the probe body 600. After the leader rod 610, the probe body 600 is inserted through the guide holes 311 and 312. Then, by separating the leader rod 610 from the probe body 600, the probe 50 is attached to the guide unit 30.

(2) Guide Unit 30

The guide unit 30 includes two guide plates 301 and 302 that support the probes 50 and a connecting spacer 303 that connects these guide plates 301 and 302 to each other.

The upper guide plate 301 is a plate-like member, such as a ceramic plate, in which two or more upper guide holes 311 are formed. The upper guide holes 311 are holes that penetrate through the upper guide plate 301 in the thickness direction, through which the probe 50 is inserted, and they support the vicinity of the upper end of the probe 50.

The lower guide plate 302 is a plate-like member, such as a ceramic plate, in which two or more lower guide holes 312 are formed. It is arranged to face the lower surface of the upper guide plate 301 via the connecting spacer 303. The lower guide plate 302 is positioned below the upper guide plate 301, parallel to the upper guide plate 301 at a predetermined distance. The lower guide holes 312 are holes that penetrate through the lower guide plate 302 in the thickness direction, through which the probe 50 is inserted, and they support the vicinity of the lower end of the probe 50 in a manner that allows it to move up and down. Preferably, the upper guide holes 311 and the lower guide holes 312, through which the same probe 50 is inserted, are aligned in a direction perpendicular to the guide plates 301 and 302 to facilitate the insertion of the leader rod 610, but the present invention is not limited to such a configuration.

(3) Probe 50 (Probe Body 600)

The probe 50 is a vertical-type probe that extends in a direction substantially perpendicular to the guide plates 301 and 302. The probe 50 is made of a conductive material with an elongated shape. Metal materials with both good elastic and conductive properties, such as nickel (Ni) alloys or palladium (Pd) alloys, are used for the probe 50. The probe 50 may be made of a single conductive material, but it can also be made of two or more conductive materials. For example, materials with particularly high conductive properties, such as gold (Au) or copper (Cu), can be used in part.

The probe 50 includes an upper rod 501, a lower rod 502, a curved portion 503, and a stopper 510. The upper rod 501 and the lower rod 502 are connected via the curved portion 503. The stopper 510 is provided on the upper rod 501.

The upper rod 501 has a substantially straight shape, is inserted through the upper guide hole 311, and is supported by the upper guide plate 301. The upper end of the upper rod 501 protrudes upward from the guide unit 30, and the lower end of the upper rod 501 is connected to the curved portion 503 within the guide unit 30.

The lower rod 502 has a substantially straight shape, is inserted through the lower guide hole 312, and is supported by the lower guide plate 302. The lower end of the lower rod 502 protrudes downward from the guide unit 30, and the upper end of the lower rod 502 is connected to the curved portion 503 within the guide unit 30. Although the lower rod 502 is shown as being coaxial with the upper rod 501 in the figure, the present invention is not limited to such a configuration.

The curved portion 503 has a curved shape and elastically deforms under the pressure exerted by the object under test during inspection. The curved portion 503 buckles under the external force received from the object under test, allowing the probe 50 to elastically contact the object under test. By providing the curved portion 503, it is possible to predetermine the part and direction of the probe 50 that will deform, thereby suppressing contact between adjacent probes 50.

The stopper 520 is a protruding part provided on the side surface of the upper rod 501. By engaging the stopper 510 with the upper surface of the upper guide plate 301, the probe 50 is prevented from falling out of the guide unit 30. Since the probe body 600 is identical to the probe 50, the corresponding components are assigned the same reference numerals, and redundant explanations are omitted.

(4) Leader Rod 610

The leader rod 610 is a member that is inserted through the guide holes 311 and 312 ahead of the probe body 600, facilitating the insertion of the probe body 600 through the guide holes 311 and 312. The leader rod 610 has a substantially straight shape, and the upper end of the leader rod 610 is connected to the lower end of the probe body 600, specifically to the lower end of the lower rod 502.

Preferably, the maximum cross-sectional area of the leader rod 610 is smaller than the maximum cross-sectional area of the lower rod 502. Preferably, the leader rod 610 is to be coaxial with the lower rod 502. In other words, when viewed from the axial direction, the cross-section of the leader rod 610 should be within the outline of the cross-section of the lower rod 502. The material of the leader rod 610 may be the same as that of the probe body 600 or it may be a different material.

A tip portion 620 of the leader rod 610 has a tapered shape with a cross-sectional area that decreases toward the tip. By making the lower end of the leader rod 610 tapered, it is possible to facilitate the insertion of the leader rod 610 through the guide holes 311 and 312.

The leader rod 610 is connected to the probe body 600 at the connecting portion 630. It is preferable that the connecting portion 630 does not break during the insertion of the composite probe 60 through the guide unit 30, but can be easily broken when the entire leader rod 610 has passed through the guide unit 30 and is protruding from the guide unit 30. For example, by providing an appropriate notch, it is possible to ensure that the composite probe 60 does not break during insertion and that the leader rod 610 can be easily broken after passing through.

(5) Method for Attaching the Probe 50

Figure 2:
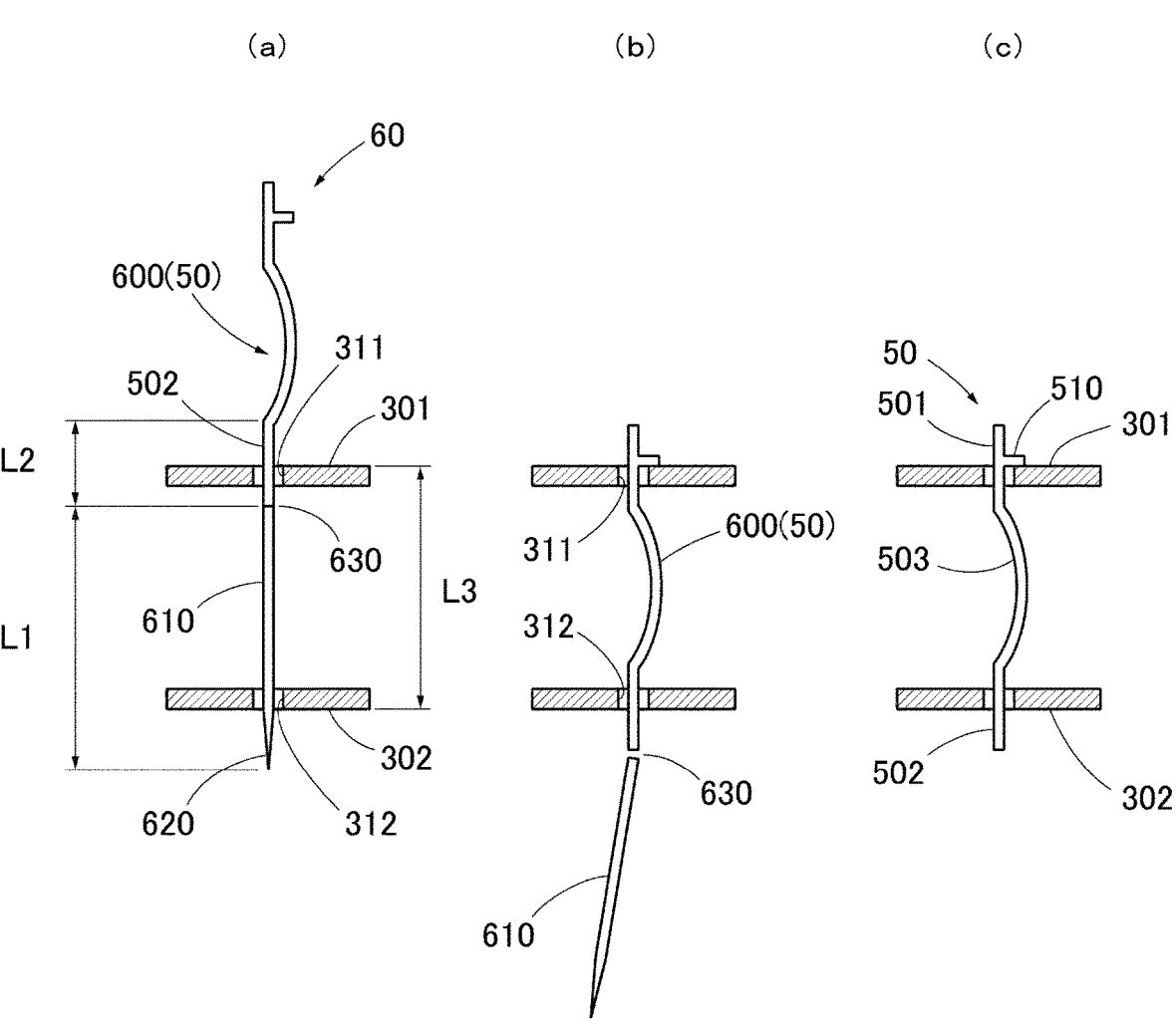
FIG. 2 is a diagram showing an example of a method for attaching the probe 50 to the guide unit 30 using the composite probe 60.

FIG. 2 is a diagram showing an example of a method for attaching the probe 50. The process of attaching the probe 50 to the guide unit 30 using the composite probe 60 is shown in chronological order in steps (a) to (c) in the figure. The probe attachment process shown in the figure is part of the manufacturing process of the probe card and is also part of the repair process for replacing damaged probes 50 in the probe card.

Step (a) in the figure shows the same state as in FIG. 1, focusing on the composite probe 60. It shows the state after the leader rod 610 has been inserted through the upper guide hole 311 and further inserted through the lower guide hole 312.

Step (b) in the figure shows the state in which the entire leader rod 610 protrudes below the lower guide plate 302, and the leader rod 610 is being separated. The leader rod 610 can be separated, for example, by applying an external force in the bending direction or by irradiating it with a laser beam.

If the sum of the length L1 of the leader rod 610 and the length L2 of the lower rod 502 is greater than the distance L3 between the non-facing surfaces of the guide plates 301 and 302, the tip portion 620 of the leader rod 610 will be inserted through the lower guide hole 312 before the curved portion 503 is inserted through the upper guide hole 311 and the posture of the composite probe 60 changes. Therefore, the tip portion 620 of the leader rod 610 can be inserted through the lower guide hole 312 without being affected by the curved portion 503. Note that the distance L3 between the non-facing surfaces of the guide plates 301 and 302 refers to the distance between the upper surface of the upper guide plate 301 and the lower surface of the lower guide plate 302.

Step (c) in the figure shows the state after the leader rod 610 has been separated. Only the probe body 600 remains in the guide unit 30, with the stopper 510 engaged with the upper guide plate 301, the upper rod 501 supported by the upper guide plate 301, and the lower rod 502 supported by the lower guide plate 302. In other words, the probe 50 is attached to the guide unit 30.

(6) Probe Card 1

Figure 3:
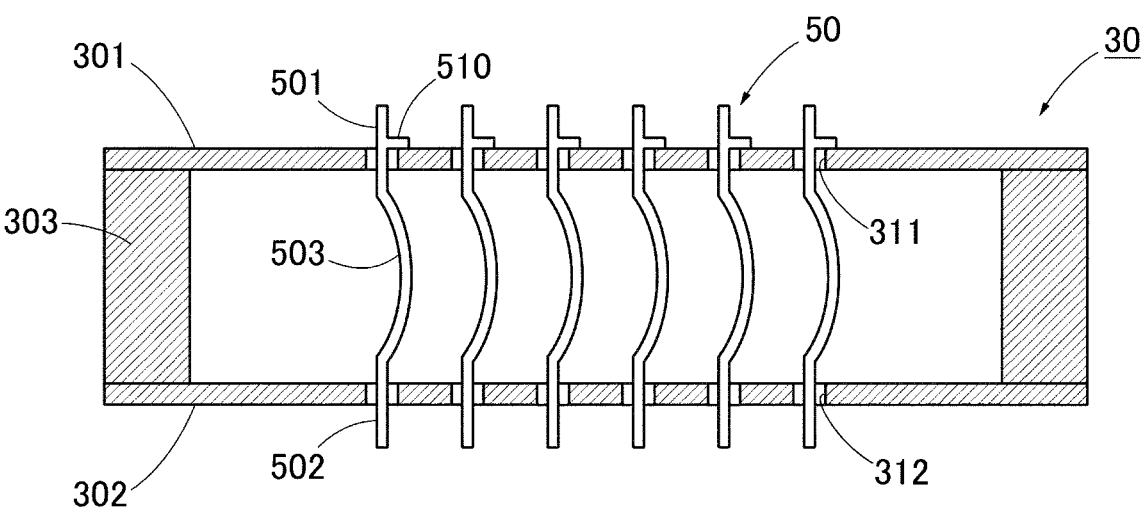
FIG. 3 is a diagram showing the guide unit 30 with all necessary probes 50 attached.
Figure 4:
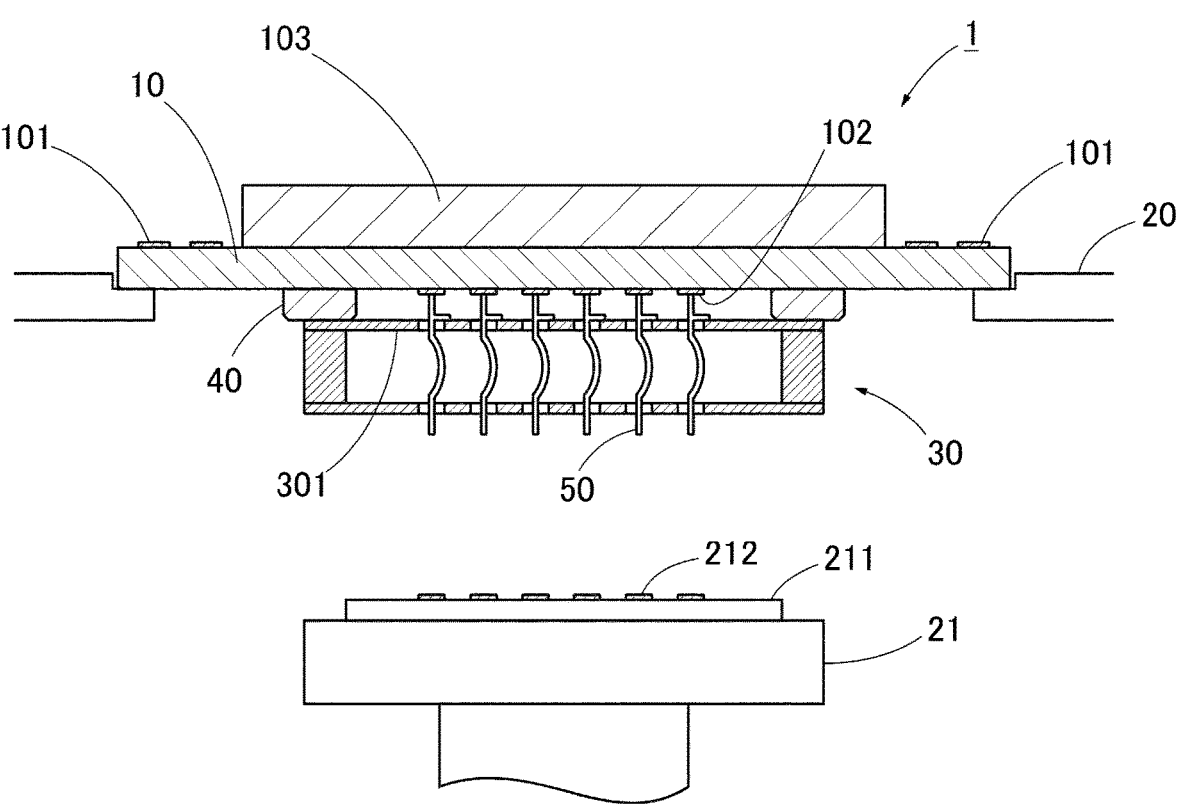
FIG. 4 is a diagram showing the probe card 1 with the guide unit 30 attached.

FIG. 3 is a diagram showing the guide unit 30 with all necessary probes 50 attached. FIG. 4 is a diagram showing the probe card 1 with the guide unit 30 of FIG. 3 attached. The cross-section shown is of the probe card 1 horizontally arranged in a wafer prober, cut along a vertical plane.

The probe card 1 is attached to a card holder 20 in such a manner that the installation surface of the probes 50 faces the semiconductor wafer 211 on the stage 21. By moving the stage 21 up and down, the probes 50 can be brought into contact with the electrode terminals 212 on the semiconductor wafer 211. The probe card 1 includes a main substrate 10, a reinforcing plate 103, the guide unit 30, and two or more probes 50.

The main substrate 10 is a wiring substrate that can be detachably attached to a wafer prober. The outer peripheral edge of its lower surface is supported by the card holder 20 of the wafer prober and is arranged horizontally. A reinforcing plate 103 is attached to the central part of the upper surface of the main substrate 10, and two or more external terminals 101 to which signal terminals of a tester device (not shown) are connected are provided on the outer peripheral edge. Two or more probe electrodes 102 for connecting the probes 50 are provided in the central part of the lower surface. The probe electrodes 102 and the external terminals 101 are electrically connected to each other through the main substrate 10.

The guide unit 30 is a supporting member that supports two or more probes 50 in a manner that allows vertical movement and positions them within the horizontal plane. It is attached to face the lower surface of the main substrate 10 via a mounting spacer 40. In other words, the upper guide plate 301 is positioned below the main substrate 10, parallel to it, at a predetermined distance.

The probe 50 has a shape that extends in a direction intersecting the main substrate 10, with both its upper and lower ends protruding from the guide unit 30. The upper end of the probe 50 is connected to the probe electrode 102, and the lower end of the probe 50 can be brought into contact with the electrode terminal 212 on the object under test.

(7) Connecting Portion 630

Figure 5:
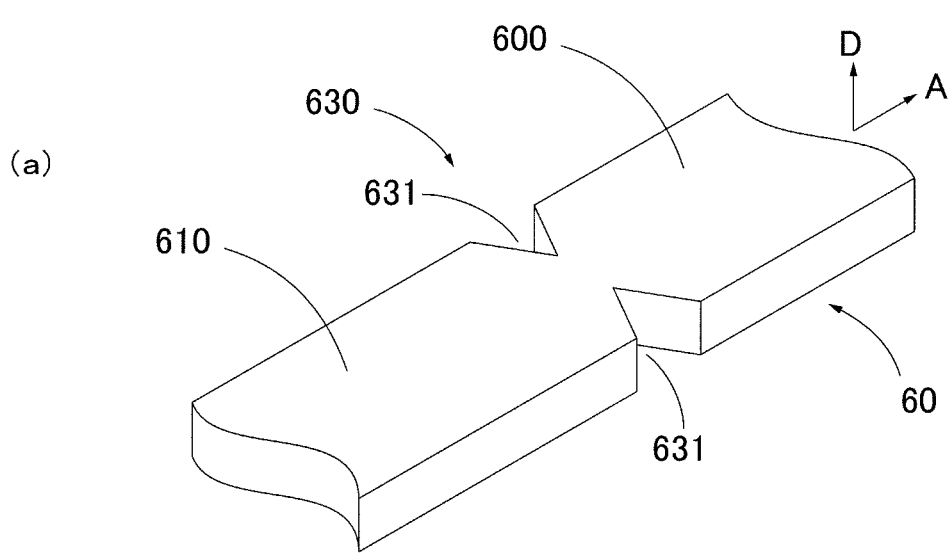
FIG. 5 is a diagram showing an example of the detailed configuration of the composite probe 60, illustrating the appearance of the connecting portion 630.
Figure 5:
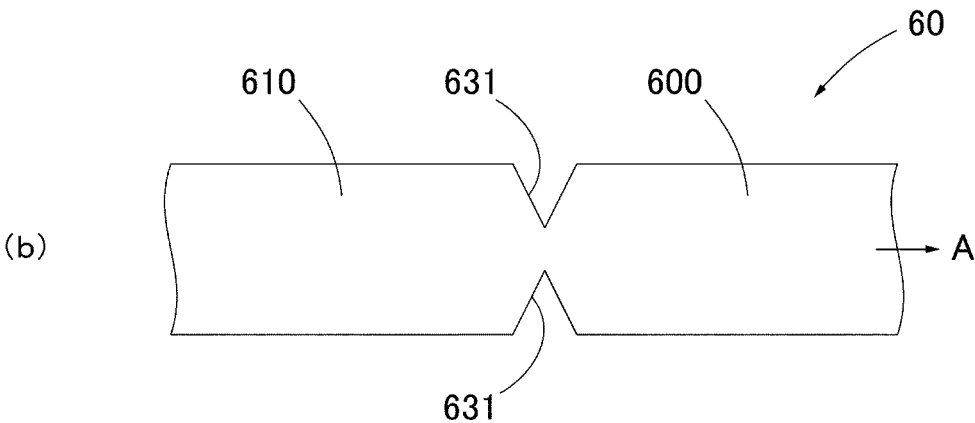
Figure 5:
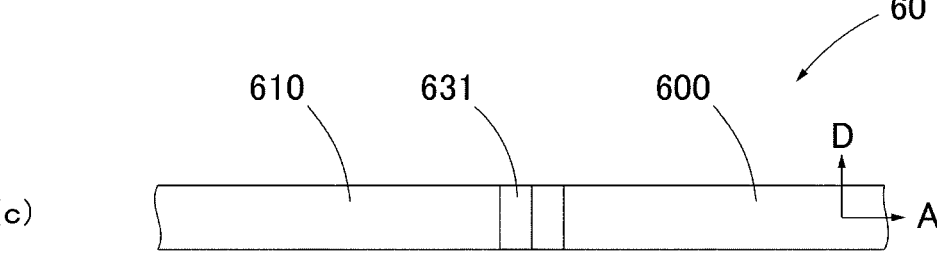

FIG. 5 is a diagram showing an example of the detailed configuration of the composite probe 60, illustrating the appearance of the connecting portion 630. Part (a) in the figure is a perspective view of the connecting portion 630, part (b) is a front view when the laminated surfaces are directly facing, and part (c) is a side view in the width direction of the composite probe 60.

The connecting portion 630 has a pair of notches 631 formed in it. The connecting portion 630 is narrower and has a smaller cross-sectional area than the probe body 600 and the leader rod 610. The pair of notches 631 are, for example, wedge-shaped with their vertices facing each other and are formed on the opposing sides of the composite probe 60, which has a rectangular cross-section.

The composite probe 60 is formed by laminating metal materials using a plating method. The laminating direction D is perpendicular to the axial direction A of the composite probe 60, and the laminating planes are perpendicular to the laminating direction D. In this specification, the size of the composite probe 60 in the laminating direction D is referred to as the thickness, and the size in the direction that intersects both the laminating direction D and the axial direction A is referred to as the width. The pair of notches 631 are recesses formed on the opposing sides of the composite probe 60 in the width direction, and they can be realized as patterns on the laminating planes. The tapered shape of the tip portion 620 of the leader rod 610 can also be realized as a similar pattern.

The probe body 600 and the leader rod 610 are formed simultaneously in the same laminating process. In other words, the probe body 600 and the leader rod 610 are made of the same material and are formed integrally. In this case, the probe body 600 and the leader rod 610 are firmly connected, but by providing notches 631 of appropriate shape and size, it is possible to ensure that the composite probe 60 does not break during insertion. After the entire leader rod 610 has passed through the guide unit 30, the connecting portion 630 can be easily broken.

In this embodiment, an example is described in which the probe body 600 and the leader rod 610 are made of the same material and formed integrally. However, the composite probe 60 according to the present invention is not limited to such a configuration. For example, even if the probe body 600 and the leader rod 610 are made of different materials or are sequentially laminated in different laminating processes, the configuration with the notches 631 can be adopted if both are firmly connected.

In this embodiment, an example is described in which the notches 631 are wedge-shaped. However, the notches 631 according to the present invention are not limited to this configuration and can be of any shape.

Second Embodiment

Figure 6:
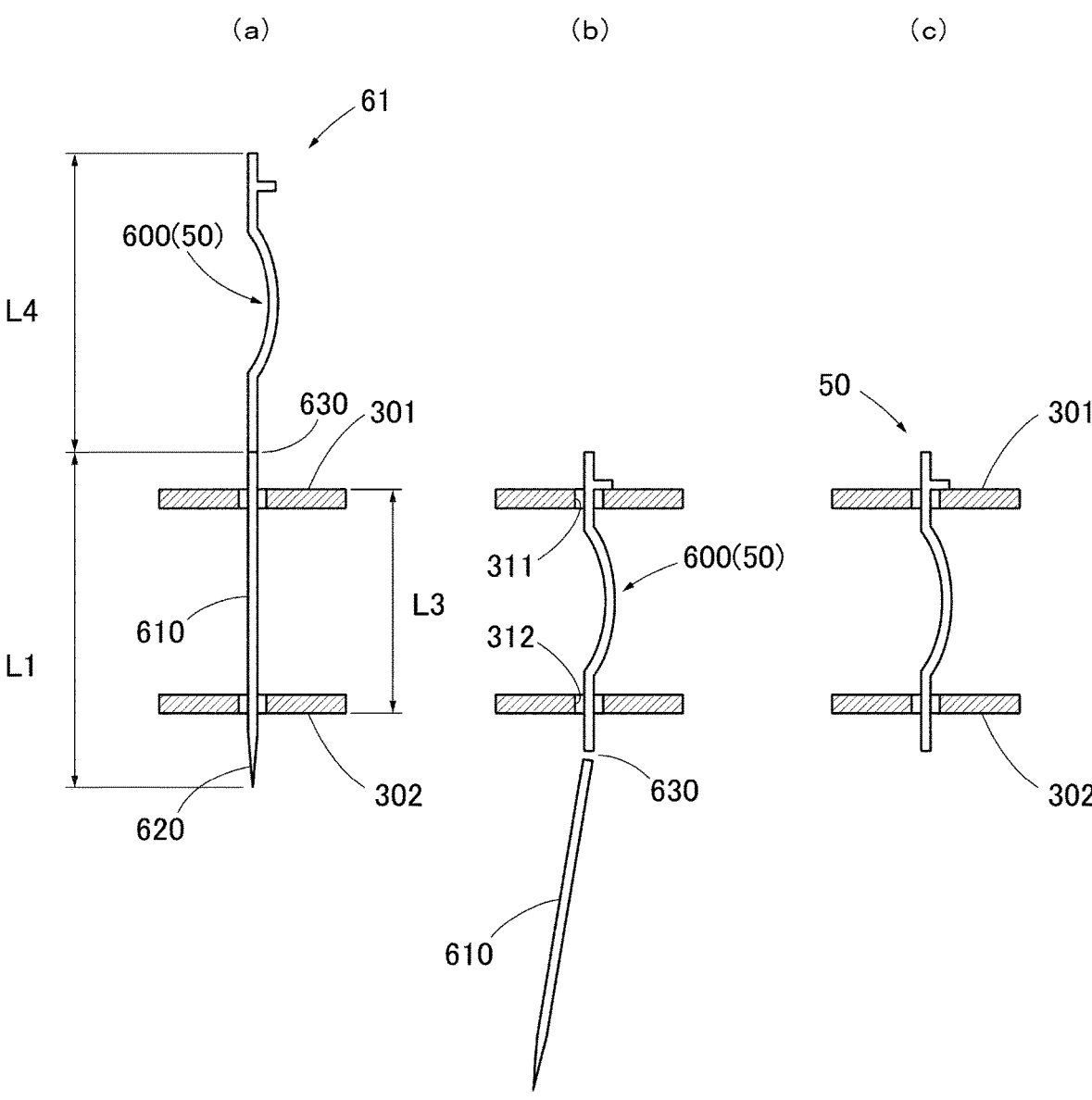
FIG. 6 is a diagram showing a configuration example of a composite probe 61 according to the second embodiment of the present invention.

FIG. 6 is a diagram showing an example of a configuration of a composite probe 61 according to the second embodiment of the present invention. Compared to the composite probe 60 of the first embodiment in FIG. 2, the composite probe 61 has a different length of the leader rod 610. Other configurations are the same as those of the composite probe 60, and therefore, redundant explanations are omitted.

The length L1 of the leader rod 610 is configured to be greater than the distance L3 between the non-facing surfaces of the guide plates 301 and 302. By adopting this configuration, the tip portion 620 is inserted through the lower guide hole 312 before the connecting portion 630 is inserted through the upper guide hole 311. Therefore, it is possible to prevent the connecting portion 630 from breaking before the leader rod 610 is inserted through the lower guide hole 312. Additionally, even if the lower rod 502 is curved or if the leader rod 610 is not coaxial with the lower rod 502, the straight shape of the leader rod 610 facilitates the insertion of the composite probe 61.

It is more preferable that the length L1 of the leader rod 610 be equal to or greater than the length L4 of the probe body 600. Since the length L4 of the probe body 600 is greater than the distance L3 between the non-facing surfaces of the guide plates 301 and 302, if the length L1 of the leader rod 610 is equal to or greater than the length L4 of the probe body 600, the length L1 of the leader rod 610 can be made greater than the distance L3 between the non-facing surfaces of the guide plates 301 and 302, regardless of the actual distance L3 between the non-facing surfaces of the guide plates 301 and 302 used. This facilitates the insertion of the composite probe 61. Note that the length L4 of the probe body 600 refers to the straight distance between both ends.

Third Embodiment

In the first embodiment, an example of the composite probe 60 inserted into the guide unit 30 from the upper guide plate 301 side was described. In the third embodiment, the composite probe 62 inserted into the guide unit 30 from the lower guide plate 302 side will be described.

Figure 7:
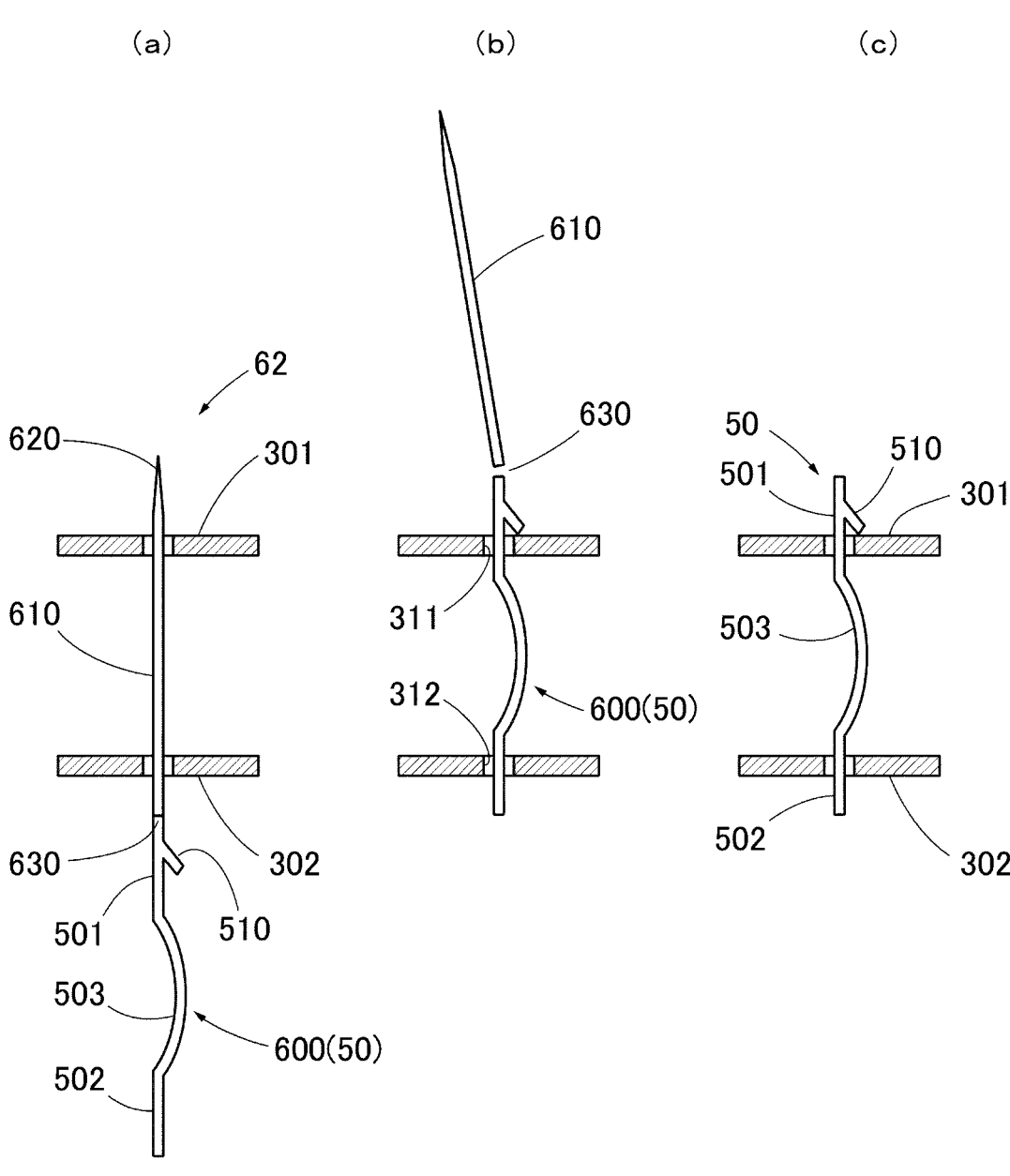
FIG. 7 is a diagram showing a configuration example of a composite probe 62 according to the third embodiment of the present invention.

FIG. 7 is a diagram showing an example of a configuration of a composite probe 62 according to the third embodiment of the present invention. The process of attaching the probe 50 to the guide unit 30 using the composite probe 62 is shown in chronological order in steps (a) to (c) in the figure. The probe attachment process shown in the figure is part of the manufacturing process of the probe card and is also part of the repair process for replacing damaged probes 50 on the probe card.

The composite probe 62 differs from the composite probe 60 of the first embodiment in that the leader rod 610 is connected to the upper end of the probe body 600, and the stopper 510 can pass through the guide holes 311 and 312 from the bottom to the top. Other configurations are the same as those of the composite probe 60, and therefore, redundant explanations are omitted.

The leader rod 610 is connected to the upper end of the upper rod 501. Preferably, the maximum cross-sectional area of the leader rod 610 is smaller than the maximum cross-sectional area of the upper rod 501, excluding the stopper 510. It is also preferable that the leader rod 610 is coaxial with the upper rod 501. In other words, when viewed from the axial direction, the cross-section of the leader rod 610 should be within the outline of the cross-section of the upper rod 501.

The stopper 510 is configured to pass through the guide holes 311 and 312 upwards but not downwards. For example, the stopper 510 is made of an elastically deformable member that extends obliquely downward from the side surface of the upper rod 501. When inserted into the guide holes 311 and 312 from below, it elastically deforms to reduce its protrusion, allowing it to pass through the guide holes 311 and 312. On the other hand, when attempting to insert it into the guide holes 311 and 312 from above, it elastically deforms to increase its protrusion, preventing it from passing through the guide holes 311 and 312. Therefore, the stopper 510, which has passed through the upper guide hole 311 upwards, engages with the upper surface of the upper guide plate 301.

Step (a) in the figure shows the state after the leader rod 610 has been inserted through the lower guide hole 312 and further through the upper guide hole 311.

Step (b) in the figure shows the state in which the entire leader rod 610 protrudes above the upper guide plate 301, and the leader rod 610 is being separated. The leader rod 610 can be separated, for example, by applying an external force in the bending direction or by irradiating it with a laser beam.

In this embodiment, an example has been described in which the stopper 510 is provided on the upper rod 501 and engages with the upper surface of the upper guide plate 301. However, the present invention is not limited to this configuration. For example, the stopper 510 can be provided on the lower rod 502, pass through only the lower guide hole 312 upwards, and engage with the upper surface of the lower guide plate 302.

Step (c) in the figure shows the state after the leader rod 610 has been separated. Only the probe body 600 remains in the guide unit 30, with the stopper 510 engaged with the upper guide plate 301, the upper rod 501 supported by the upper guide plate 301, and the lower rod 502 supported by the lower guide plate 302. In other words, the probe 50 is attached to the guide unit 30.

Fourth Embodiment

In the first embodiment, an example is described in which the connecting portion 630 is provided with notches 631. In the fourth embodiment, an example is described in which the probe body 600 and the leader rod 610 are bonded at the interface in the connecting portion 630.

Figure 8:
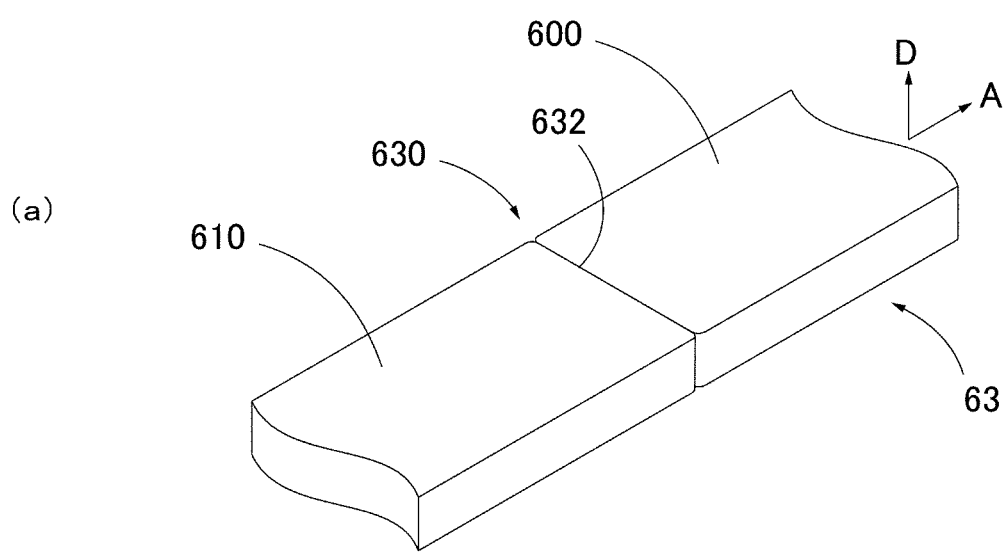
FIG. 8 is a diagram showing an example of the detailed configuration of a composite probe 63 according to the fourth embodiment of the present invention, illustrating the appearance of the connecting portion 630.
Figure 8:
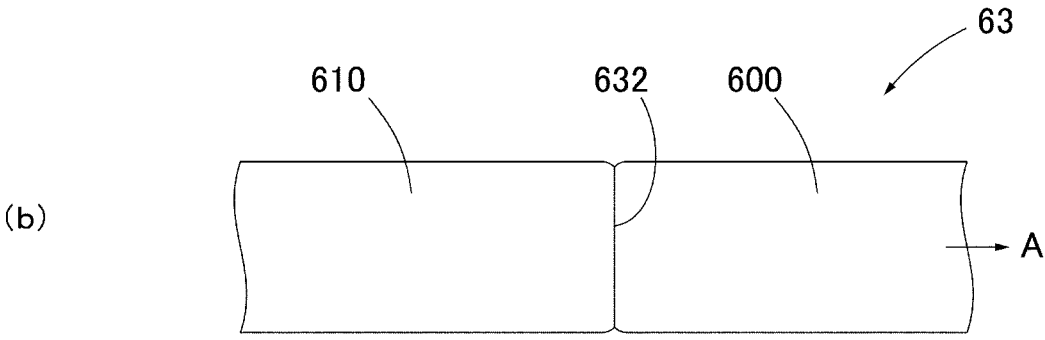
Figure 8:
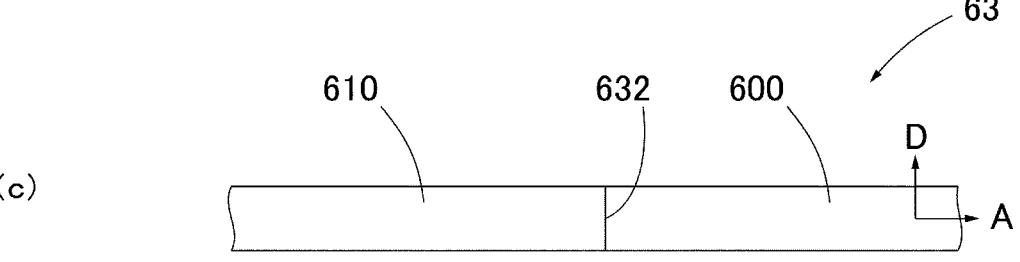

FIG. 8 is a diagram showing an example of the detailed configuration of a composite probe 63 according to the fourth embodiment of the present invention, illustrating the appearance of the connecting portion 630. Part (a) in the figure is a perspective view of the connecting portion 630, part (b) is a front view when the laminated surfaces are directly facing, and part (c) is a side view in the width direction of the composite probe 63.

The composite probe 63 differs from the composite probe 60 of the first embodiment in FIG. 5 only in the configuration of the connecting portion 630. Other configurations are the same, and therefore, redundant explanations are omitted.

The connecting portion 630 has a joining surface 632 where the probe body 600 and the leader rod 610 are joined. Both the probe body 600 and the leader rod 610 are metal layers formed by a plating method, but they are formed sequentially in different laminating processes and are joined at an interface (joining surface 632) perpendicular to the axial direction A of the leader rod 610.

When the joining surface 632 of the two metal layers that are not laminated simultaneously is parallel to the laminating direction D, the bonding strength at the joining surface is weaker compared to when it is parallel to the laminating plane. Therefore, by sequentially forming the probe body 600 and the leader rod 610 and joining them at an interface parallel to the laminating direction D, it becomes easier to break at the joining surface 632 and separate the leader rod 610 from the probe body 600 when an external force is applied.

Figure 9:
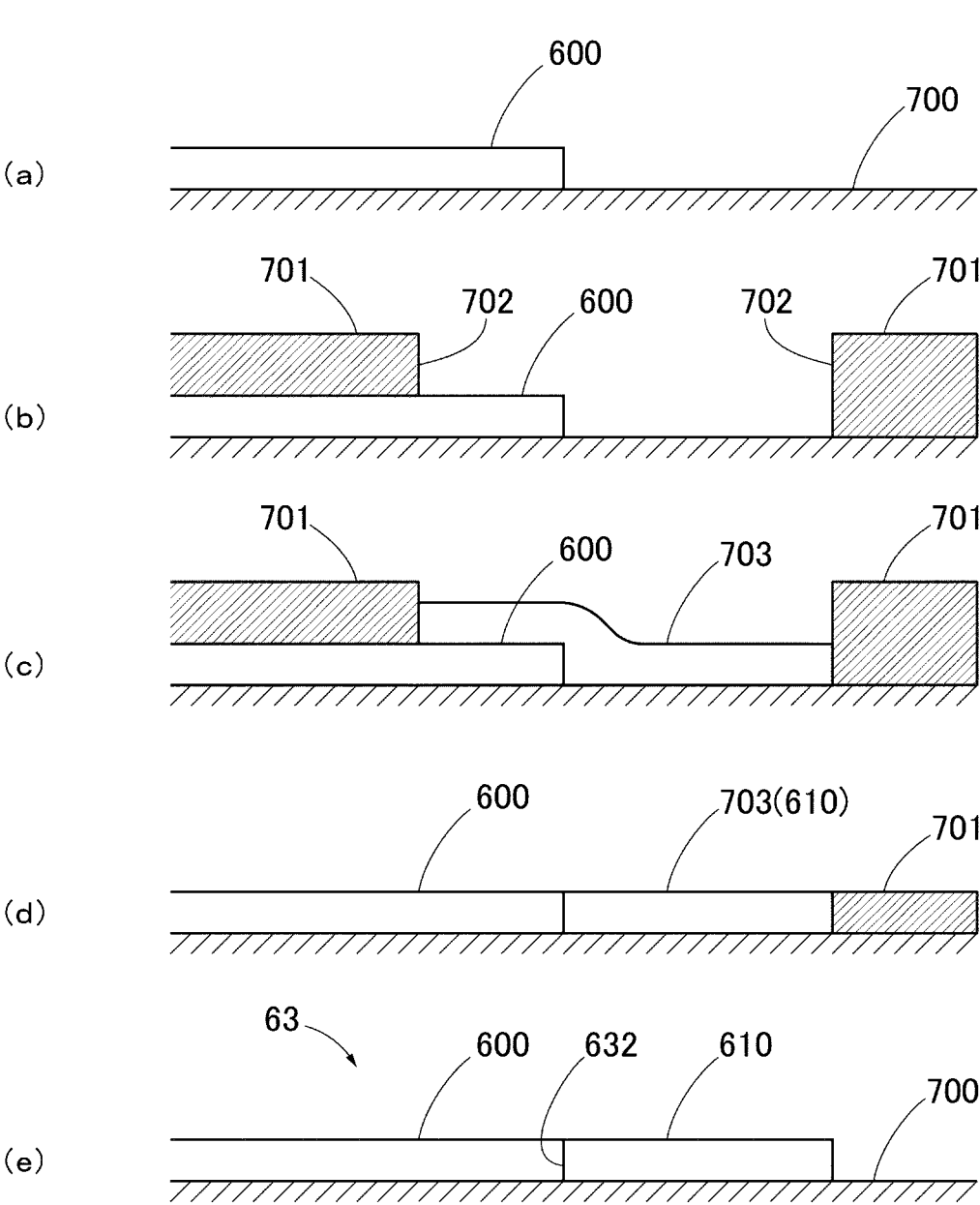
FIG. 9 is a diagram showing an example of a method for manufacturing the composite probe 63.

FIG. 9 is a diagram showing an example of a manufacturing method for the composite probe 63, with the main steps (a) to (e) of the manufacturing process for the composite probe 63 shown in chronological order. The composite probe 63 is manufactured using an electroplating method. First, the probe body 600 is formed by electroplating on a substrate 700 for probe formation (step (a)). The probe body 600 is patterned to include the upper rod 501, the lower rod 502, and the curved portion 503.

Next, a photoresist 701 is formed. After the photoresist 701 is formed over the entire surface of the substrate 700, selective exposure and development are carried out to form an opening 702 in the area corresponding to the leader rod 610 (step (b)). By forming the opening 702, the end surface of the probe body 600 and the substrate 700 are exposed.

Next, a metal layer 703 is formed by electroplating within the opening 702 (step (c)). Subsequently, a polishing process is performed to flatten the laminated surface, creating a metal layer 703 with the same thickness as the probe body 600 and bonded to the end surface of the probe body 600. The metal layer 703 corresponds to the leader rod 610 (step (d)). Finally, the photoresist is removed, and the composite probe 63 is separated from the substrate 700 (step (e)).

In this embodiment, a method for manufacturing a composite probe is described in which the leader rod 610 is formed after the formation of the probe body 600. However, the present invention is not limited to such a manufacturing method. For example, a configuration can also be adopted in which the probe body 600 is formed after the formation of the leader rod 610.

Fifth Embodiment

In the first embodiment, an example of a connecting portion 630 with notches 631 provided on the sides in the width direction is described. In the fifth embodiment, a connecting portion 630 with additional notches 635 on the laminated surfaces will be described.

Figure 10:
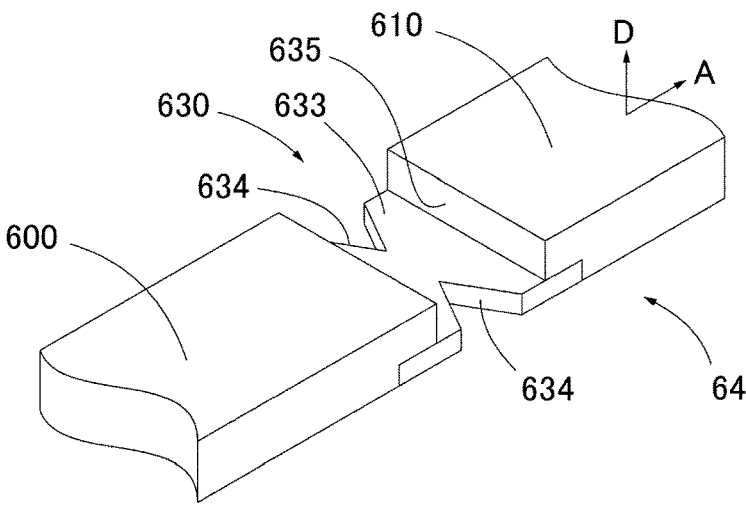
FIG. 10 is a diagram showing an example of the detailed configuration of a composite probe 64 according to the fifth embodiment of the present invention, illustrating the appearance of the connecting portion 630.
Figure 10:
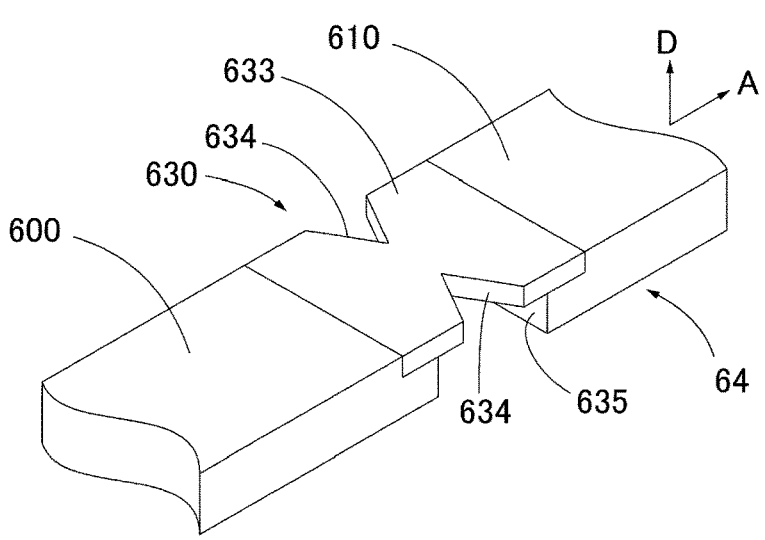
Figure 10:
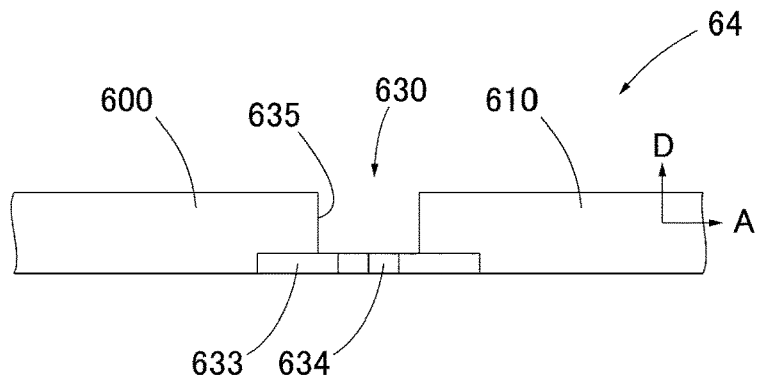

FIG. 10 is a diagram showing an example of the detailed configuration of a composite probe 64 according to the fifth embodiment of the present invention, illustrating the appearance of the connecting portion 630. Part (a) and part (b) in the figure are perspective views of the connecting portion 630 from different directions, and part (c) is a side view showing the side in the width direction.

The composite probe 64 differs from the composite probe 60 of the first embodiment in FIG. 5 only in the configuration of the connecting portion 630. Other configurations are the same, and therefore, redundant explanations are omitted.

The connecting portion 630 is constituted by a connecting chip 633 that connects the probe body 600 and the leader rod 610. The probe body 600 and the leader rod 610 are spaced apart in the axial direction A, with one end of the connecting chip 633 connected to the probe body 600 and the other end connected to the leader rod 610. The connecting chip 633 and the probe body 600, as well as the leader rod 610, are bonded at an interface parallel to the laminated surface, ensuring that they are strongly connected at this interface to prevent easy breakage.

The width of the connecting chip 633 is the same as that of the probe body 600 and the leader rod 610. A pair of notches 634 are formed on the opposing sides in the width direction of the connecting chip 633. The shape and formation method of the notches 634 are the same as those of the notches 631 of the first embodiment in FIG. 5.

The thickness of the connecting chip 633 is thinner than that of the probe body 600 and the leader rod 610. Therefore, notches 635 are also formed on the laminated surface between the probe body 600 and the leader rod 610. The notches 635 are recesses on the laminated surface formed by the step difference between the connecting chip 633 and the probe body 600 and the leader rod 610.

By adopting such a configuration, the cross-sectional area of the connecting portion 630 is reduced in the width direction by the notches 634 and in the thickness direction by the notches 635, making it easier to break.

The connecting chip 633 is firmly connected to the probe body 600 and the leader rod 610. By providing notches 634 and 635 of appropriate shape and size, it is possible to ensure that the connecting portion 630 does not break during the insertion of the composite probe 60 and can be easily broken after the entire leader rod 610 has passed through the guide unit 30.

Figure 11:
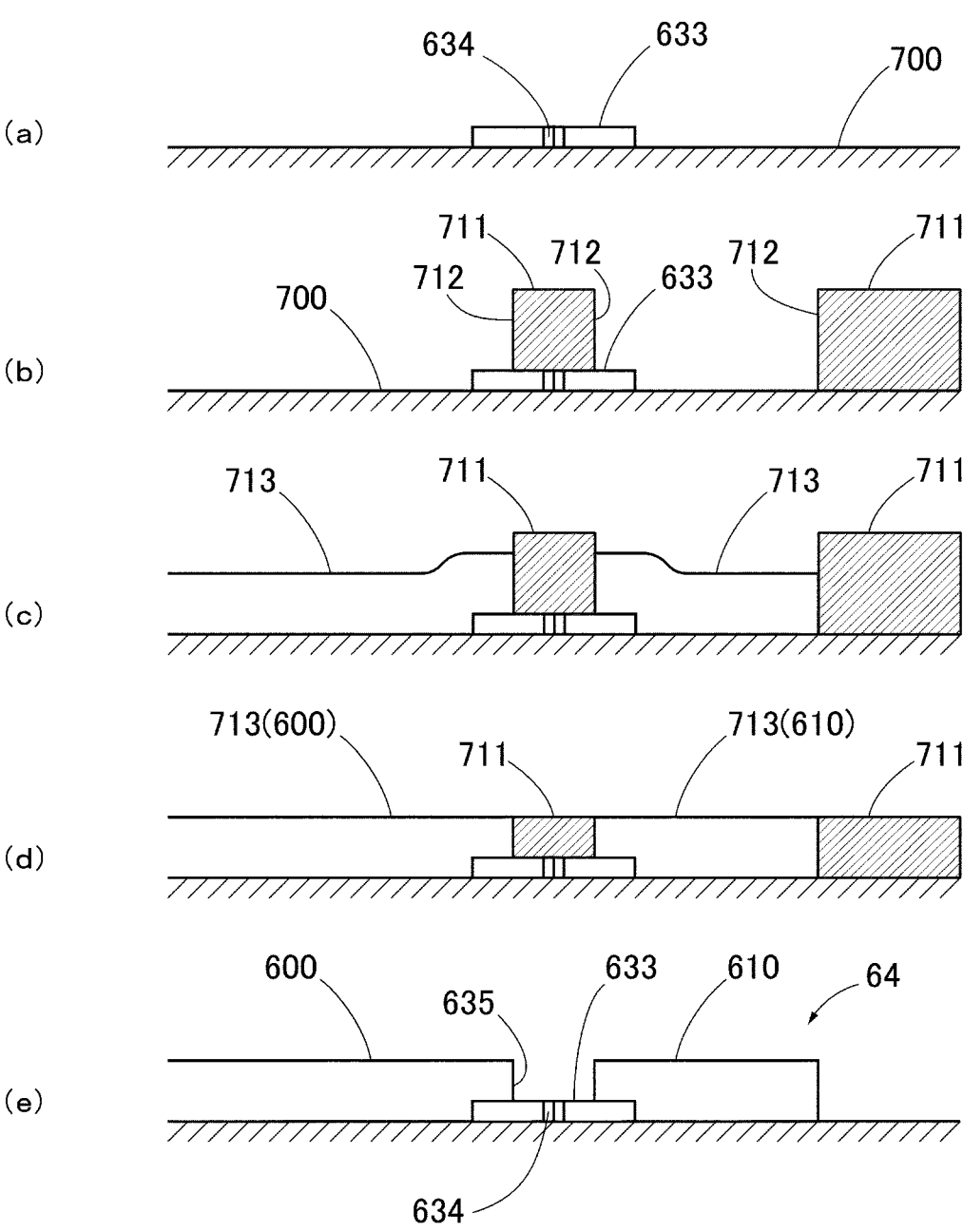
FIG. 11 is a diagram showing an example of a method for manufacturing the composite probe 64.

FIG. 11 is a diagram showing an example of a method for manufacturing the composite probe 64, with the main steps (a) to (e) of the manufacturing process for the composite probe 64 shown in chronological order. The composite probe 64 is manufactured using an electroplating method. First, the connecting chip 633 is formed by electroplating on a substrate 700 for probe formation (step (a)). The connecting chip 633 is patterned to have a pair of notches 634.

Next, a photoresist 711 is formed. After the photoresist 711 is formed over the entire surface of the substrate 700, selective exposure and development are carried out to form openings 712 in the areas corresponding to the probe body 600 and the leader rod 610 (step (b)). By forming the openings 712, the upper surfaces of both ends of the connecting chip 633 and the substrate 700 are exposed.

Next, a metal layer 713 is formed by electroplating within the openings 712 (step (c)). Subsequently, a polishing process is performed to flatten the laminated surface, creating two metal layers 713, each having a greater thickness than the connecting chip 633 and bonded to the upper surfaces at both ends of the connecting chip 633. The metal layers 713 correspond to the probe body 600 and the leader rod 610 (step (d)). Finally, the photoresist 711 is removed, and the composite probe 64 is separated from the substrate 700 (step (e)).

In this embodiment, an example of a connecting portion 630 having both notches 634 on the sides in the width direction and notches 635 on the laminated surface is described. However, the present invention is not limited to such a configuration. For example, the connecting portion 630 can be configured to have only the notches 635 on the laminated surface.

In this embodiment, an example is described in which the width of the connecting chip 633 is the same as the width of the probe body 600 and the leader rod 610. However, the present invention is not limited to such a configuration. For example, the width of the connecting chip 633 may be smaller than the width of the probe body 600 and the leader rod 610.

Sixth Embodiment

In the fourth embodiment, an example of a connecting portion 630 in which the probe body 600 and the leader rod 610 are joined at the interface is described. In the fifth embodiment, an example of a connecting portion 630 in which the probe body 600 and the leader rod 610 are connected by a connecting chip 633 is described. In the sixth embodiment, a connecting portion 630 that combines these features will be described.

Figure 12:
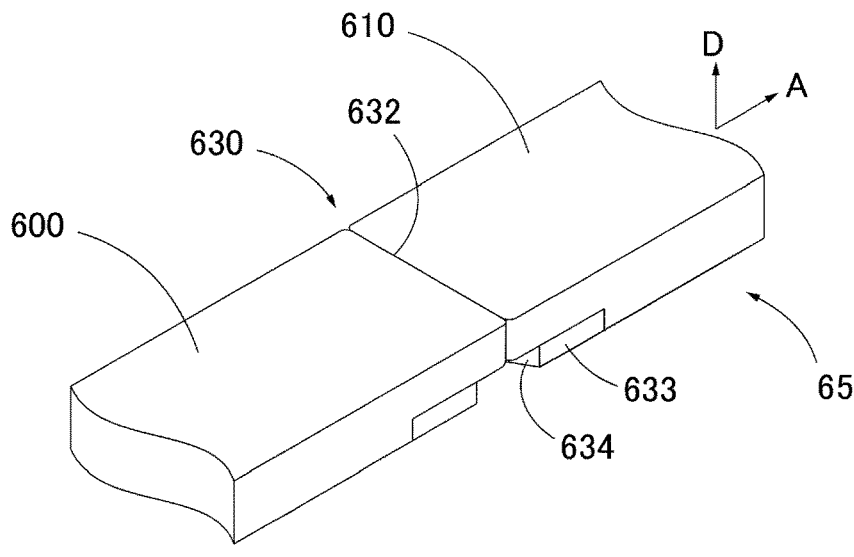
FIG. 12 is a diagram showing an example of the detailed configuration of a composite probe 65 according to the sixth embodiment of the present invention, illustrating the appearance of the connecting portion 630.
Figure 12:
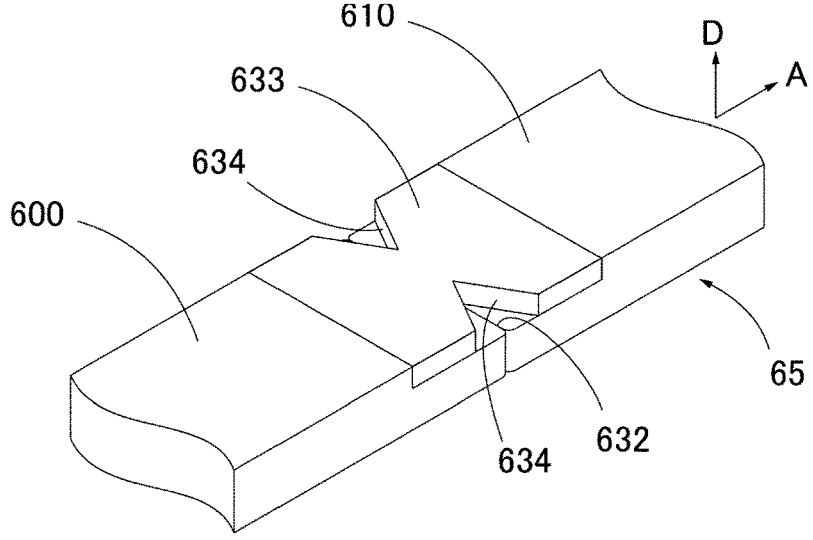
Figure 12:
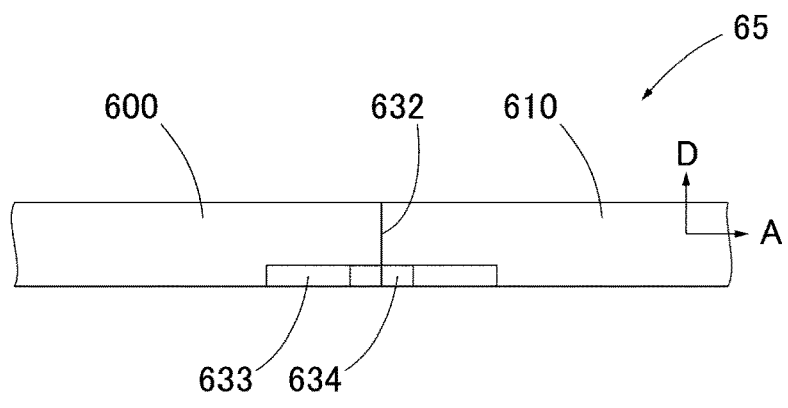

FIG. 12 is a diagram showing an example of the detailed configuration of a composite probe 65 according to the sixth embodiment of the present invention, illustrating the appearance of the connecting portion 630. Part (a) and part (b) in the figure are perspective views of the connecting portion 630 from different directions, and part (c) is a side view showing the side in the width direction.

The composite probe 65 differs from the composite probe 60 of the first embodiment in FIG. 5 only in the configuration of the connecting portion 630. Other configurations are the same, and therefore, redundant explanations are omitted.

The connecting portion 630 includes a joining surface 632 where the probe body 600 and the leader rod 610 are joined, and a connecting chip 633 that connects the probe body 600 and the leader rod 610. The joining surface 632 and the connecting chip 633 are formed at different positions in the thickness direction of the connecting portion 630. In parts (a) and (c) of the figure, the joining surface 632 is provided on the upper side, and the connecting chip 633 is provided on the lower side.

The probe body 600 and the leader rod 610 are both metal layers formed by a plating method, sequentially formed in different laminating processes, and joined at an interface (joining surface 632) perpendicular to the laminated surface. Therefore, the bonding strength at this joining surface is weaker compared to a joining surface parallel to the laminated surface. This makes it easier to break at the joining surface 632 and separate the leader rod 610 from the probe body 600 when an external force is applied.

The probe body 600 and the leader rod 610 are connected via the connecting chip 633. The connecting chip 633 and the probe body 600, as well as the leader rod 610, are bonded at an interface parallel to the laminated surface, ensuring a strong connection that does not easily break.

The width of the connecting chip 633 is the same as that of the probe body 600 and the leader rod 610. A pair of notches 634 are formed on the opposing sides in the width direction of the connecting chip 633. The shape and formation method of the notches 634 are the same as those of the notches 631 of the first embodiment in FIG. 5. The thickness of the connecting chip 633 is thinner than that of the probe body 600 and the leader rod 610. Therefore, the cross-sectional area of the connecting chip 633 is smaller than that of the probe body 600 and the leader rod 610. Additionally, the width is further reduced by the notches 634, resulting in a smaller minimum cross-sectional area, making it easier to break.

Therefore, by aligning the positions of the joining surface 632 and the notches 634 in the axial direction A, it is possible to ensure that the composite probe 65 breaks at this position when an external force is applied. Since the connecting portion 630 of the composite probe 65 is provided with both the joining surface 632 and the connecting chip 633, it does not break during insertion through the guide unit 30, but can be easily broken after the entire leader rod 610 has passed through.

Figure 13:
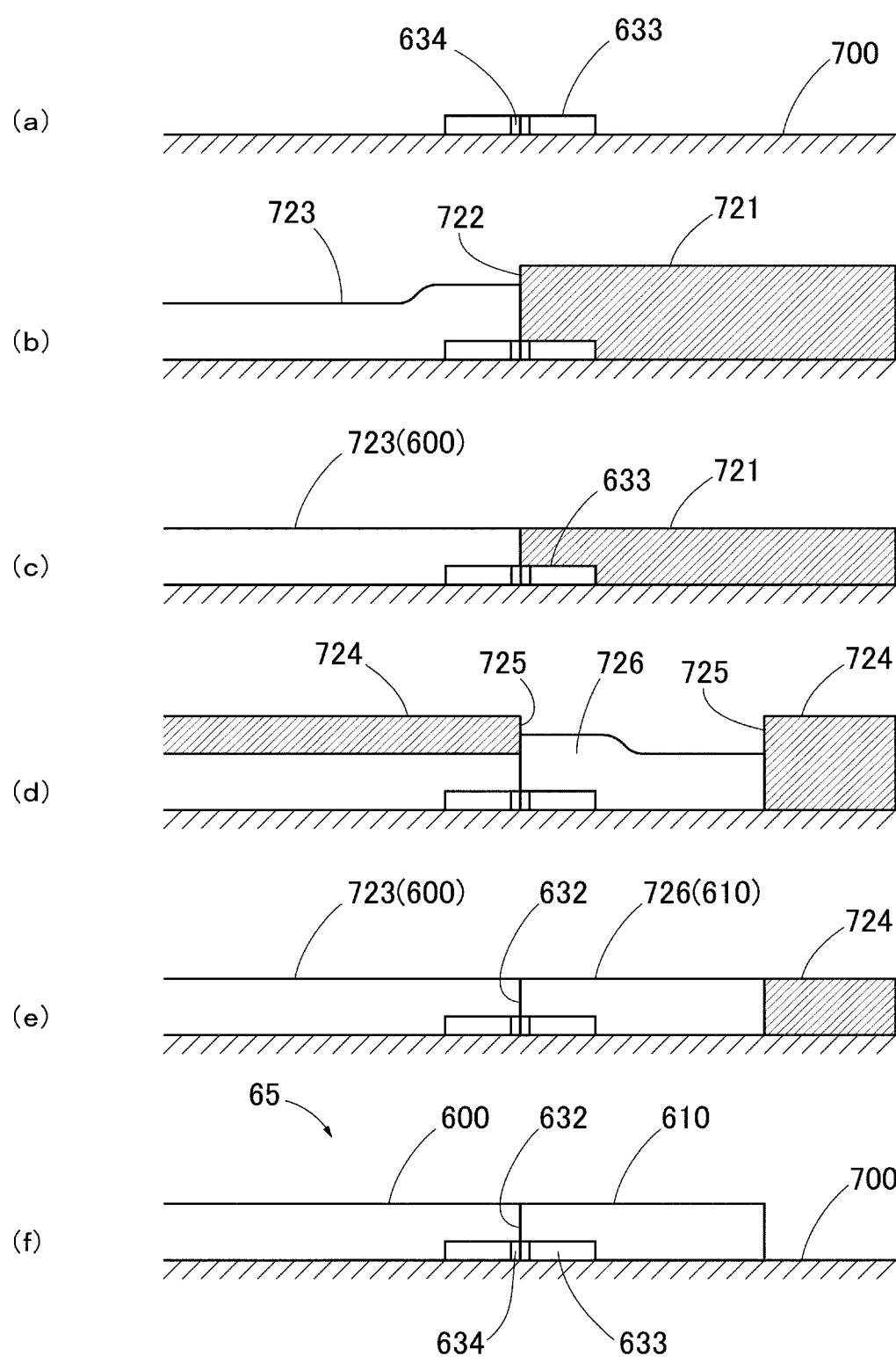
FIG. 13 is a diagram showing an example of a method for manufacturing the composite probe 65.
Figure 14:
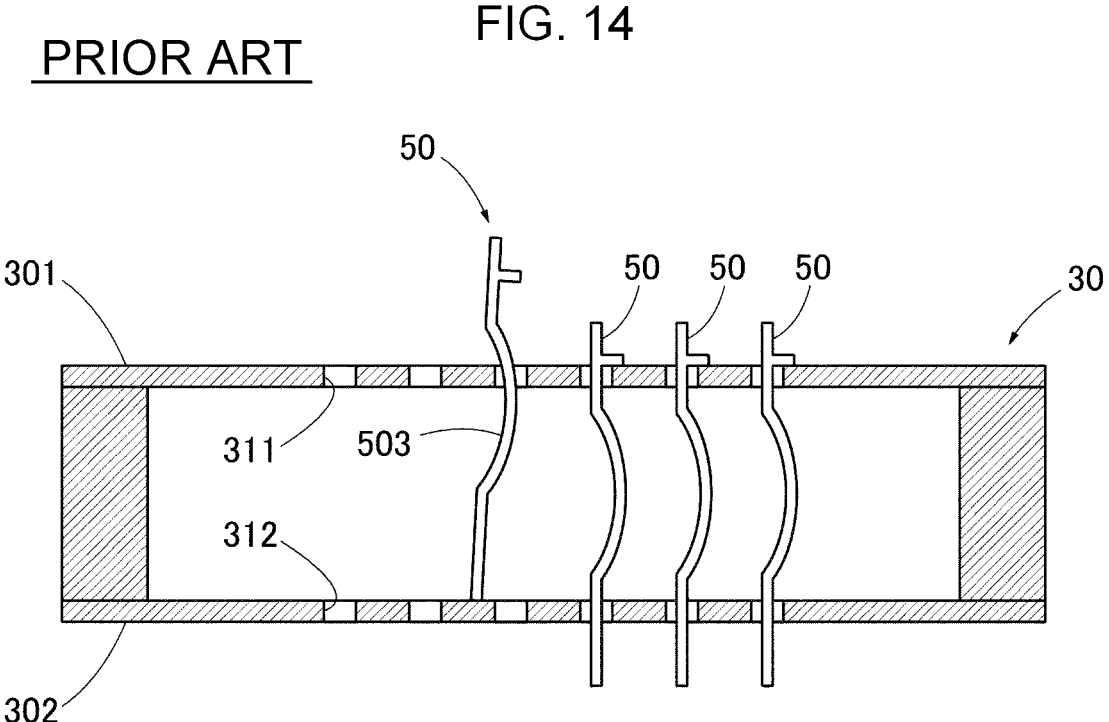
FIG. 14 is a diagram showing how the probe 50 is attached to the guide unit 30 by the conventional method.

FIG. 13 is a diagram showing an example of a method for manufacturing the composite probe 65, with the main steps (a) to (f) of the manufacturing process for the composite probe 65 shown in chronological order. The composite probe 65 is manufactured using an electroplating method. First, the connecting chip 633 is formed by electroplating on a substrate 700 for probe formation (step (a)). The connecting chip 633 is patterned to have a pair of notches 634.

Next, a photoresist 721 is formed. After the photoresist 721 is formed over the entire surface of the substrate 700, selective exposure and development are carried out to form an opening 722 in the area corresponding to the probe body 600. In the opening 722, the left half of the upper surface of the connecting chip 633 and a part of the substrate 700 are exposed. Subsequently, a metal layer 723 is formed by electroplating within the opening 722 (step (b)).

Next, a polishing process is performed to flatten the laminated surface, creating the metal layer 723 bonded to the left half of the upper surface of the connecting chip 633 (step (c)). The metal layer 723, through the patterning of the photoresist 721, forms the probe body 600, which includes the upper rod 501, the lower rod 502, and the curved portion 503.

After the photoresist 721 is removed, another photoresist 724 is formed. After the photoresist 724 is formed over the entire surface of the substrate 700, selective exposure and development are carried out to form an opening 725 in the area corresponding to the leader rod 610. In the opening 725, the right half of the upper surface of the connecting chip 633 and a part of the substrate 700 are exposed. Subsequently, a metal layer 726 is formed by electroplating within the opening 725 (step (d)).

Next, a polishing process is performed to flatten the laminated surface, creating the metal layer 726 that is bonded to the right half of the upper surface of the connecting chip 633 and also bonded to the probe body 600 at the joining surface 632 (step (e)). The metal layer 726 corresponds to the leader rod 610.

After that, the photoresist 724 is removed, and the composite probe 65 is separated from the substrate 700 (step (f)).

In this embodiment, an example is described in which the width of the connecting chip 633 is the same as the width of the probe body 600 and the leader rod 610. However, the width of the connecting chip 633 may be smaller than the width of the probe body 600 and the leader rod 610. An example of a method for manufacturing a composite probe is described in which the leader rod 610 is formed after the formation of the probe body 600, but the probe body 600 may also be formed after the formation of the leader rod 610.

The method for attaching probes according to the present invention can be applied not only to the manufacture of the probe card 1 but also to the repair of the probe card 1 by replacing damaged probes 50. During the repair of the probe card 1, the length of the probes 50 may have decreased due to wear. Therefore, it is preferable to measure the length of the probe 50 during repair and use a composite probe 60 for the repair of the probe card 1, where the length L4 of the probe body 600 matches the measured length.

In this case, it is preferable to use a composite probe set composed of two or more composite probes 60 with different lengths L4 of the probe body 600. By measuring the length of the probe 50 and selecting the appropriate composite probe 60 from the composite probe set, the repair of the probe card 1 can be performed quickly.

The composite probes 60 that constitute the composite probe set should preferably have the same total length, for example, the sum of the length L4 of the probe body 600 and the length L1 of the leader rod 610. By matching the total length of the composite probes 60, storage and transportation of the composite probe set become easier, and manufacturing costs can be reduced. For instance, when adopting the manufacturing method shown in FIG. 9, if the lengths of the probe bodies 600 differ, the mask patterns used in step (a) would also differ. However, by standardizing the total length of the composite probes 60, the same mask pattern can be used in subsequent steps from step (b) onward, thereby reducing manufacturing costs.

REFERENCE SIGNS LIST

1 PROBE CARD
10 MAIN SUBSTRATE
101 EXTERNAL TERMINAL
102 PROBE ELECTRODE
103 REINFORCING PLATE
20 CARD HOLDER
21 STAGE
211 SEMICONDUCTOR WAFER
212 ELECTRODE TERMINAL
30 GUIDE UNIT
301 UPPER GUIDE PLATE
302 LOWER GUIDE PLATE
303 CONNECTING SPACER
311 UPPER GUIDE HOLE
312 LOWER GUIDE HOLE
40 MOUNTING SPACER
50 PROBE
501 UPPER ROD
502 LOWER ROD
503 CURVED PORTION
510 STOPPER
60-65 COMPOSITE PROBE
600 PROBE BODY
610 LEADER ROD
620 TIP PORTION
630 CONNECTING PORTION
631, 634, 635 NOTCH
632 JOINING SURFACE
633 CONNECTING CHIP
700 SUBSTRATE
701, 711, 721, 724 PHOTORESIST
702, 712, 722, 725 OPENING
703, 713, 723, 726 METAL LAYER

The invention claimed is:

1. A composite probe, comprising:
a probe body housed in a guide unit of a probe card including a first guide plate and a second guide plate arranged apart from each other, and supported by a first guide hole of the first guide plate and a second guide hole of the second guide plate; and
a leader rod, one end of which is connected to the probe body, having a substantially straight shape, inserted through the first guide hole ahead of the probe body, further passing through the second guide hole, and detachable from the probe body after passing through the second guide hole, wherein
the probe body includes
a first rod having a substantially straight shape and supported by the first guide hole,
a second rod having a substantially straight shape and supported by the second guide hole, and
a curved portion disposed between the first guide plate and the second guide plate, and connecting the first rod and the second rod, and
the leader rod is connected to a tip of the second rod coaxially with the second rod, and
a total length of the leader rod and the second rod is greater than a sum of a distance between facing surfaces of the first guide plate and the second guide plate and thicknesses of the first guide plate and the second guide plate.

2. The composite probe according to claim 1, wherein
a length of the leader rod is greater than the sum of the distance between the facing surfaces of the first guide plate and the second guide plate and thicknesses of the first guide plate and the second guide plate.
3. The composite probe according to claim 2, further comprising:
a connecting portion connecting the leader rod and the second rod, wherein
the connecting portion is a metal layer laminated by a plating method, and a thickness in a lamination direction is smaller than that of the leader rod and the second rod.
4. The composite probe according to claim 2, wherein
the leader rod and the second rod are metal layers sequentially laminated by a plating method and bonded at interfaces approximately parallel to a lamination direction.
5. The composite probe according to claim 1, wherein
a length of the leader rod is equal to or greater than a length of the probe body.
6. The composite probe according to claim 5, further comprising:
a connecting portion connecting the leader rod and the second rod, wherein
the connecting portion is a metal layer laminated by a plating method, and a thickness in a lamination direction is smaller than that of the leader rod and the second rod.
7. The composite probe according to claim 5, wherein
the leader rod and the second rod are metal layers sequentially laminated by a plating method and bonded at interfaces approximately parallel to a lamination direction.
8. The composite probe according to claim 1, wherein
the leader rod and the second rod are metal layers sequentially laminated by a plating method and bonded at interfaces approximately parallel to a lamination direction.
9. The composite probe according to claim 1, further comprising:
a connecting portion connecting the leader rod and the second rod, wherein
the connecting portion is a metal layer laminated by a plating method, and a thickness in a lamination direction is smaller than that of the leader rod and the second rod.
10. A method for attaching a probe to a guide unit of a probe card including a first guide plate and a second guide plate arranged apart from each other, comprising:
inserting a leader rod through a first guide hole of the first guide plate ahead of a probe body by using a composite probe constituted by the probe body and the leader rod, the probe body including a first rod supported by the first guide hole of the first guide plate, a second rod supported by a second guide hole of the second guide plate, and a curved portion disposed between the first guide plate and the second guide plate and connecting the first rod and the second rod, and the leader rod being connected to a tip of the probe body;
further inserting the leader rod, inserted through the first guide hole, through the second guide hole of the second guide plate, before the curved portion is inserted through the first guide hole; and
detaching the leader rod from the probe body while the probe body is supported by the first guide hole and the second guide hole.

11. A method for manufacturing a probe card, comprising:

utilizing the method for attaching a probe according to claim 10 to attach a probe to a guide unit; and attaching the guide unit to which the probe is attached to a wiring board.

* * * * *